(12) United States Patent
Jones et al.

(10) Patent No.: US 9,087,557 B2
(45) Date of Patent: Jul. 21, 2015

(54) PROGRAMMING MULTIPLE SERIAL INPUT DEVICES

(71) Applicant: Advantest Corporation, Tokyo (JP)

(72) Inventors: Michael Jones, San Carlos, CA (US); David Eskeldson, Colorado Springs, CO (US); Darrin Albers, Fort Collins, CO (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 14/066,124

(22) Filed: Oct. 29, 2013

(65) Prior Publication Data

US 2015/0117130 A1    Apr. 30, 2015

(51) Int. Cl.
| | |
|---|---|
| *G11C 7/00* | (2006.01) |
| *G11C 5/02* | (2006.01) |
| *G11C 7/10* | (2006.01) |
| *G11C 5/04* | (2006.01) |

(52) U.S. Cl.
CPC ......... *G11C 5/025* (2013.01); *G11C 5/04* (2013.01); *G11C 7/1015* (2013.01)

(58) Field of Classification Search
CPC ...... G11C 16/10; G11C 7/1006; G11C 29/32; G11C 7/1051; G11C 5/02; G11C 5/025; G11C 5/04; H01L 25/0657

USPC .................................. 365/219, 63, 51, 221
See application file for complete search history.

(56) References Cited

U.S. PATENT DOCUMENTS

| | | | |
|---|---|---|---|
| 7,065,693 B2 | 6/2006 | Konuk | |
| 7,487,419 B2 | 2/2009 | Mukherjee et al. | |
| 8,331,122 B2 * | 12/2012 | Sato et al. ........................ | 365/51 |
| 2003/0033584 A1 | 2/2003 | Zaveri et al. | |
| 2006/0082358 A1 | 4/2006 | Conner | |
| 2013/0193993 A1 | 8/2013 | Golov et al. | |
| 2013/0342236 A1 | 12/2013 | Song et al. | |
| 2014/0101500 A1 | 4/2014 | Bastimane et al. | |

* cited by examiner

*Primary Examiner* — David Lam

(57) ABSTRACT

Serial input devices (e.g., pin electronics modules) are coupled to an interface via data lines, clock lines, and select lines. A first subset and a second subset of the devices are each arrayed in columns, rows, and layers. Each data line is coupled to a respective row in the first subset and a respective row in the second subset; each clock line is coupled to a respective column in the first subset and a respective column in the second subset; and each layer in each subset is coupled to a respective select line. The interface can program a device by concurrently activating one of the data lines, one of the clock lines, and one of the select lines.

21 Claims, 4 Drawing Sheets

PROGRAMMING MULTIPLE SERIAL INPUT DEVICES

BACKGROUND

Automated test equipment (ATE) is used to test digital circuits and devices such as NAND devices (e.g., NAND Flash) and DRAM (dynamic random access memory). The ATE includes pin electronics modules (PEMs) that, generally speaking, receive a test pattern and conduct the test pattern to a unit (e.g., a circuit or device) under test. To increase throughput, multiple units can be tested in parallel. Hence, the ATE can include multiple PEMs (e.g., 48 PEMs).

Each PEM is programmed via its own serial bus; there is a respective serial bus per PEM. Each serial bus utilizes multiple input/output (I/O) pin(s) (e.g., four pins) on a controller. Thus, conventionally, 48 PEMs can require 48 buses and 192 pins.

Therefore, conventional ATE can be problematic because they rely on a relatively large number of buses, consuming resources such as physical area and I/O pins, and increasing costs. Also, the number of PEMs may be limited by the number of pins that are available and by the difficulty in routing larger numbers of serial buses.

SUMMARY

Accordingly, a design that utilizes fewer buses and therefore fewer I/O pins, and/or that is scalable to larger numbers of PEMs, would be valuable. Embodiments according to the invention provide these and other advantages.

In one embodiment, a group of serial input devices (e.g., PEMs) is coupled to an interface via control lines including data lines, clock lines, and select lines. A first subset and a second subset of the group of the devices are each arrayed in columns and rows. In one embodiment, each subset includes a first layer and a second layer. In such an embodiment, each data line is coupled to a respective row in each layer in the first subset and a respective row in each layer of the second subset, each clock line is coupled to a respective column in each layer of the first subset and a respective column in each layer of the second subset, and each layer in each subset is coupled to a respective select line. The interface can program a device by concurrently activating one of the data lines, one of the clock lines, and one of the select lines.

In such an embodiment, a test device/system can include, for example, a group of 48 PEMs that are separated into a first subset of 24 PEMs and a second subset of 24 PEMs. The first subset of PEMs includes a first layer of 12 PEMs and a second layer of 12 PEMs. The PEMs in the first layer are arranged in a four-by-three array (e.g., four columns and three rows), and the PEMs in the second layer are similarly arranged. The second subset of PEMs is arranged in the same manner as the first subset. Three data lines are coupled to the group of PEMs—each data line is coupled to one row in the first subset and one row in the second subset. Four clock lines are also coupled to the group of PEMs—each clock line is coupled to one column in the first subset and one column in the second subset. Four select lines are also coupled to the group of PEMs—each select line is coupled to one layer in one subset. A particular PEM can be programmed by activating one of the data lines, one of the clock lines, and one of the select lines. Thus, in this example embodiment, the group of 48 PEMs is programmable using only 11 control lines: three data lines, four clock lines, and four select lines. Conventionally, it would be difficult to utilize 48 PEMs because of the complexity in routing the corresponding number of serial buses. Also, it would be relatively expensive to do so in terms of both resources (e.g., area and pins) consumed and cost.

In contrast, for a given number of PEMs, embodiments according to the present invention reduce the number of control lines (serial buses) and the number of I/O pins utilized. Consequently, costs are reduced and resources are saved, and routing of the lines/buses is simplified. Furthermore, embodiments according to the invention are readily scalable to larger number of PEMs. For instance, in the example described above, 16 additional PEMs can be accommodated by adding one more row per layer and one more data line, 12 additional PEMs can be accommodated by adding one more column per subset and layer and one more clock line, and 24 additional PEMs can be accommodated by adding another layer per subset and two more select lines. Accordingly, embodiments according to the invention are adaptable to different testing requirements.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Figure 1:
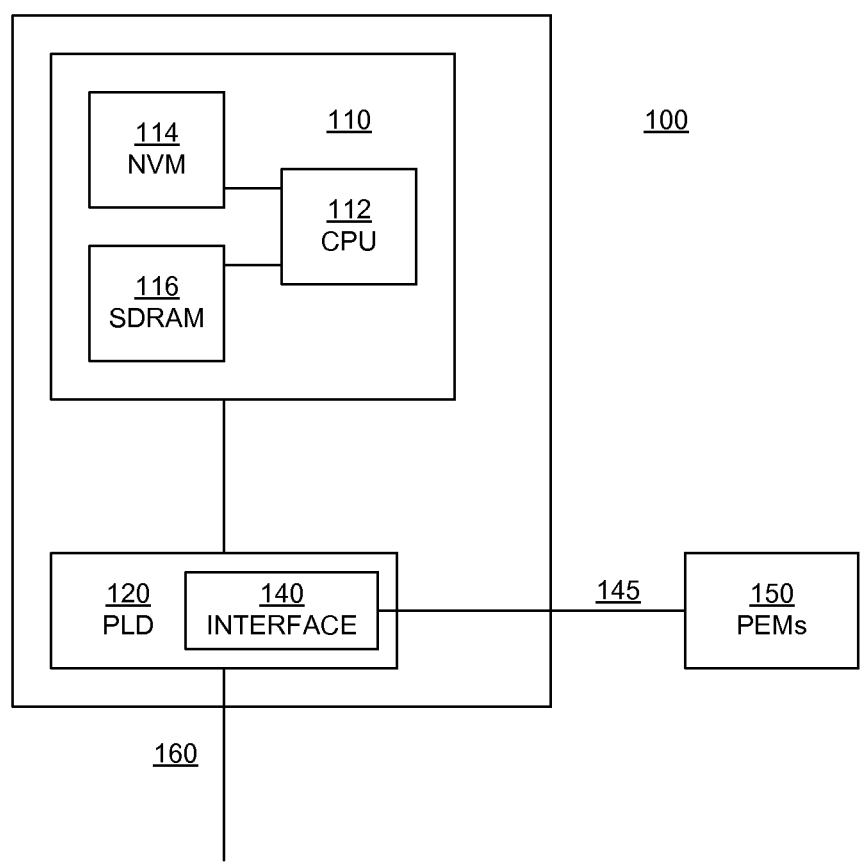
FIG. 1 is a block diagram illustrating an example of a system for implementing embodiments according to the present invention.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the embodiments of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "programming," "receiving," "activating," "enabling," "writing," "converting," "addressing," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram illustrating an example of a system 100 for implementing embodiments according to the present invention. In the example of FIG. 1, the system 100 includes a controller 110, which in turn includes a central processing unit (CPU) 112, non-volatile memory (NVM) 114, and synchronous dynamic random access memory (SDRAM) 116. The controller 110 is connected to a programmable logic device (PLD) 120, such as a field-programmable gate array (FPGA) that may also be known as a bridge FPGA. The PLD 120 controls an interface 140, which may be implemented as part of the PLD. The interface 140 is connected to a group of pin electronics modules (PEMs) 150 via a number of serial control lines 145 (e.g., serial buses). The PEMs 150 are connected to one or more units under test (not shown).

The system 100 may be known as a test site, and may be coupled in parallel to a similar test site and/or to another group of PEMs via a link 160 from the PLD 120 to a corresponding PLD in another test site.

The system 100 may include components in addition to those just described. For example, the system 100 may include a power management unit, an analog-to-digital converter, and a link in addition to the link 160. The system 100 can also include algorithm pattern generators (APGs), which may also be known as automatic test pattern generators and which may be implemented as application-specific integrated circuits (ASICs) that are coupled to the PEMs 150.

Figure 2:
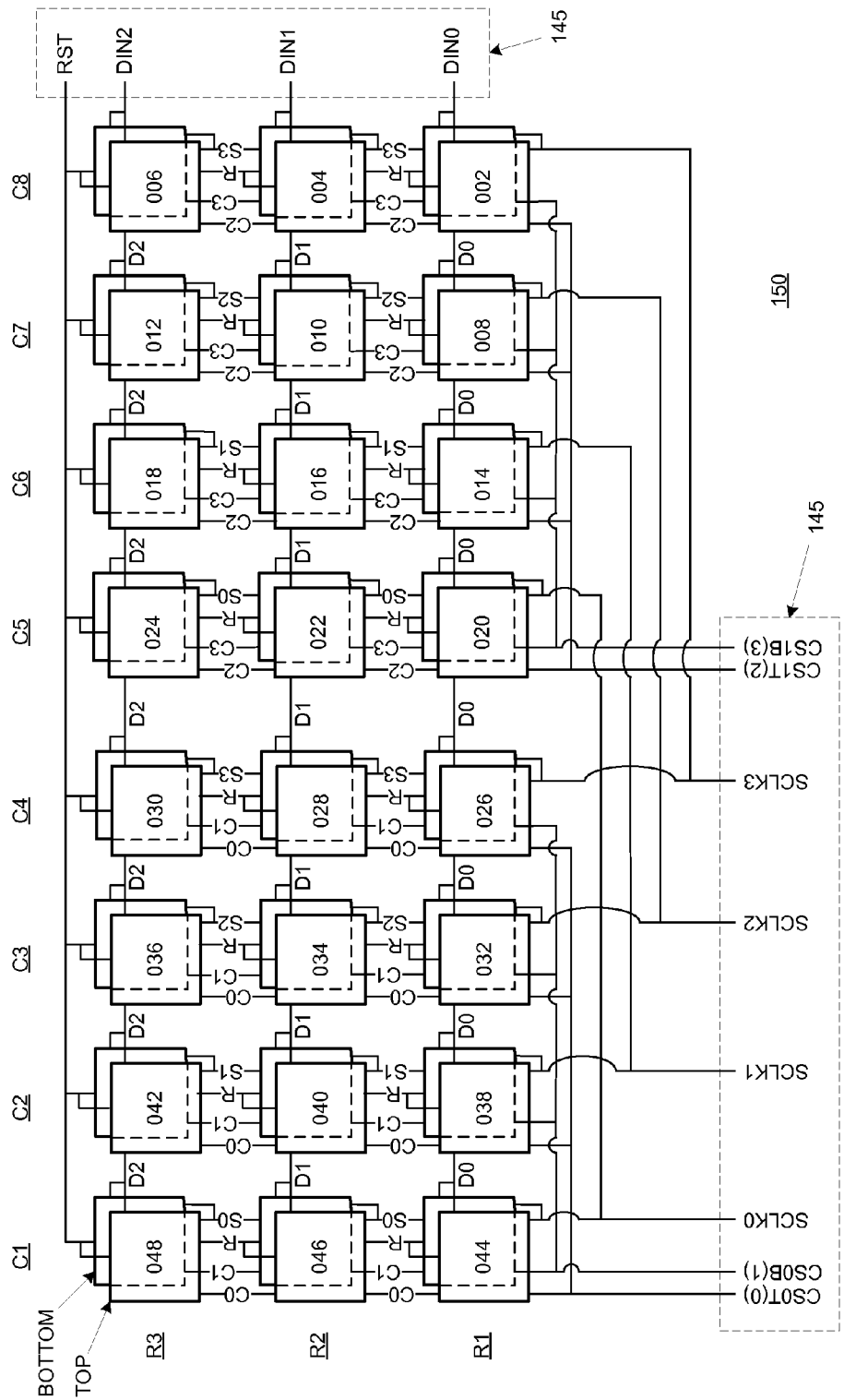
FIG. 2 is a block diagram illustrating an arrangement of PEMs in an embodiment according to the present invention.

FIG. 2 is a block diagram illustrating an arrangement of a group of PEMs 150 in an embodiment according to the present invention. In the example of FIG. 2, there are 48 PEMs in the group; however, the present invention is not so limited. In one embodiment, each of the PEMs has two channels; a channel can be selected as part of a serial protocol. To facilitate the physical layout, the channels may be in scrambled (non-sequential) order.

In the FIG. 2 embodiment, the PEMs 150 are arranged in two layers, referred to herein as the top (T) layer and the bottom (B) layer. The PEMs in the top layer are arrayed in rows R1, R2, and R3 (R1-R3) and columns C1, C2, C3, C4, C5, C6, C7, and C8 (C1-C8). The PEMs in the bottom layer are also arrayed in rows corresponding to rows R1-R3 and columns corresponding to columns C1-08. In FIG. 2, the bottom layer is partially obscured by the top layer. The PEMs in the top layer are labeled with even numbers that range from 002 to 048. The PEMs in the bottom layer can be identified using odd numbers that range from 001 to 047.

In the FIG. 2 embodiment, each layer includes 24 PEMs arranged in eight columns and three rows. Also, the group of PEMs 150 is separated into two subsets. The first subset consists of 24 PEMs arranged in two layers, each layer having 12 PEMs arranged in four columns (e.g., the four left-most columns C1-04) and three rows (R1-R3). The second subset also consists of 24 PEMs arranged in two layers, each layer having 12 PEMs arranged in four columns (e.g., the four right-most columns C5-C8) and three rows (R1-R3).

The separation of PEMs into rows, columns, layers, and/or subsets may be accomplished through logical assignments or physical arrangements or a combination of both.

As mentioned above, the group of PEMs 150 is connected to the interface 140 (FIG. 1) via control lines 145. In one embodiment, the control lines 145 are serial control lines or serial buses and include data lines (DIN), clock lines (SCLK), and select lines (CS). In FIG. 2, the data lines are designated DIN0, DIN1, and DIN2; the clock lines are designated SCLK0, SCLK1, SCLK2, and SCLK3; and the select lines are designated CS0B(0), CS0T(1), CS1B(2), and CS1T(3).

In general, each of the data lines is connected to a respective row in the first subset of PEMs in each layer of the PEMS and to a respective row in the second subset of PEMs in each layer of the PEMs. More specifically, in the embodiment of FIG. 2, the data line DIN0 is connected to each of the PEMs in the first row R1 in the first subset and to each of the PEMs in the first row R1 in the second subset, in both the top and bottom layers. That is, the data line DIN0 is connected to each of the PEMs 002, 008, 014, 020, 026, 032, 038, and 044 in the first row R1 of the top layer and to each of the PEMs 001, 007, 013, 019, 025, 031, 037, and 043 (not shown by number) in the first row R1 of the bottom layer (in FIG. 2, the label D0 is used to identify the continuation of DIN0 through the first row). The data line DIN0 is not connected to the PEMs in the other rows, and the PEMS in the first rows R1 of the top and bottom layers are not connected to the data lines DIN1 and DIN2. Thus, the PEMs 002, 008, 014, 020, 026, 032, 038, and 044 and the PEMs 001, 007, 013, 019, 025, 031, 037, and 043 can receive a signal from the data line DIN0 but cannot receive a signal from the data lines DIN1 and DIN2 (conversely, the data line DIN0 is operable for providing a data input only to the PEMs 002, 008, 014, 020, 026, 032, 038, and 044 and the PEMs 001, 007, 013, 019, 025, 031, 037, and 043).

Similarly, the data line DIN1 is connected to each of the PEMs in the second rows R2 in both the top and bottom layers (the label D1 is used to identify the continuation of DIN1 through the second row). The data line DIN1 is not connected to the PEMs in the other rows, and the PEMs in the second rows R2 are not connected to the data lines DIN0 and DIN2. Thus, the PEMs in the second rows R2 can receive a signal from the data line DIN1 but cannot receive a signal from the data lines DIN0 and DIN2.

Similarly, the data line DIN2 is connected to each of the PEMs in the third rows R3 in both the top and bottom layers (the label D2 is used to identify the continuation of DIN2 through the third row). The data line DIN2 is not connected to the PEMs in the other rows, and the PEMs in the third rows R3 are not connected to the data lines DIN0 and DIN1. Thus, the PEMs in the third rows R3 can receive a signal from the data line DIN2 but cannot receive a signal from the data lines DIN0 and DIN1.

In general, each of the clock lines is connected to a respective column in the first subset of PEMs in each layer of the PEMs and to a respective column in the second subset of PEMs in each layer of the PEMs. More specifically, in the embodiment of FIG. 2, the clock line SCLK0 is connected to each of the PEMs in the first column C1 in the first subset and to each of the PEMs in the first column C5 in the second subset, in both the top and bottom layers. That is, the clock line SCLK0 is connected to each of the PEMs 044, 046, and 048 in the first column C1 of the top layer of the first subset, to each of the PEMs 043, 045, and 047 (not shown by number) in the first column C1 of the bottom layer of the first subset, to each of the PEMs 020, 022, and 024 in the first column C5 of the top layer of the second subset, and to each of the PEMs 019, 021, and 023 (not shown by number) in the first column C5 of the bottom layer of the second subset (in FIG. 2, the label S0 is used to identify the continuation of SCLK through the columns just mentioned). The clock line SCLK0 is not connected to the PEMs in the columns C2-C4 and C6-C8, and the PEMs in the columns C1 and C5 are not connected to the clock lines SCLK1, SCLK2, and SCLK3. Thus, the PEMs 044, 046, 048, 020, 022, and 024 and the PEMs 043, 045, 047, 019, 021, and 023 can receive a signal from the clock line SCLK0 but cannot receive a signal from the clock lines SCLK1, SCLK2, and SCLK3 (conversely, the clock line SCLK0 is operable for providing a clock input only to the PEMs 044, 046, 048, 020, 022, and 024 and the PEMs 043, 045, 047, 019, 021, and 023).

Similarly, the clock line SCLK1 is connected to each of the PEMs in the second columns C2 and C6 in both the top and bottom layers in both the first and second subsets (the label S1 is used to identify the continuation of SCLK1 through these columns). The clock line SCLK1 is not connected to the PEMs in the columns C1, C3-C5, C7, and C8, and the PEMs in the columns C2 and C6 are not connected to the clock lines SCLK0, SCLK2, and SCLK3. Thus, the PEMs in the second columns C2 and C6 can receive a signal from the clock line SCLK1 but cannot receive a signal from the clock lines SCLK0, SCLK2, and SCLK3.

Similarly, the clock line SCLK2 is connected to each of the PEMs in the third columns C3 and C7 in both the top and bottom layers in both the first and second subsets (the label S2 is used to identify the continuation of SCLK2 through these columns). The clock line SCLK2 is not connected to the PEMs in the columns C1, C2, C4-C6, and C8, and the PEMs in the columns C3 and C7 are not connected to the clock lines SCLK0, SCLK1, and SCLK3. Thus, the PEMs in the third columns C3 and C7 can receive a signal from the clock line SCLK2 but cannot receive a signal from the clock lines SCLK0, SCLK1, and SCLK3.

Similarly, the clock line SCLK3 is connected to each of the PEMs in the fourth columns C4 and C8 in both the top and bottom layers in both the first and second subsets (the label S3 is used to identify the continuation of SCLK3 through these columns). The clock line SCLK3 is not connected to the PEMs in the columns C1-C3 and C5-C7, and the PEMs in the columns C4 and C8 are not connected to the clock lines SCLK0, SCLK1, and SCLK2. Thus, the PEMs in the fourth columns can receive a signal from the clock line SCLK3 but cannot receive a signal from the clock lines SCLK0, SCLK1, and SCLK2.

A first select line is connected to each PEM in one layer of the first subset, and a second select line is connected to each PEM in one layer of the second subset. In a two-layer embodiment, a third select line is connected to each PEM in the second layer of the first subset, and a fourth select line is connected to each PEM in the second layer of the second subset. More specifically, in the embodiment of FIG. 2, the select line CS0T(0) is connected to each of the PEMs in the first (e.g., top) layer of the first subset. That is, the select line CS0T(0) is connected to each of the PEMs 026, 028, 030, 032, 034, 036, 038, 040, 042, 044, 046, and 048 in the top layer of the first subset (in FIG. 2, the label C0 is used to identify the continuation of the select line CS0T(0) through the top layer of the first subset). The select line CS0T(0) is not connected to the PEMs that are not included in the top layer of the first subset, and the PEMs in the top layer of the first subset are not connected to the select lines CS0B(1), CS1T(2), and CS1B (3). Thus, the PEMs 026, 028, 030, 032, 034, 036, 038, 040, 042, 044, 046, and 048 can receive a signal from the select line CS0T(0) but cannot receive a signal from the select lines CS0B(1), CS1T(2), and CS1B(3) (conversely, the select line CS0T(0) is operable for providing an input only to the PEMs 026, 028, 030, 032, 034, 036, 038, 040, 042, 044, 046, and 048).

Similarly, the select line CS0B(1) is connected to each of the PEMs in the second (e.g., bottom) layer of the first subset (in FIG. 2, the label C1 is used to identify the continuation of the select line CS0B(1) through the bottom layer of the first subset). The select line CS0B(1) is not connected to the PEMs that are not included in the bottom layer of the first subset, and the PEMs in the bottom layer of the first subset are not connected to the select lines CS0T(0), CS1T(2), and CS1B (3). Thus, the PEMs in the bottom layer of the first subset can receive a signal from the select line CS0B(1) but cannot receive a signal from the select lines CS0T(0), CS1T(2), and CS1B(3).

Similarly, the select line CS1T(2) is connected to each of the PEMs in the first (e.g., top) layer of the second subset (in FIG. 2, the label C2 is used to identify the continuation of the select line CS1T(2) through the top layer of the second subset). The select line CS1T(2) is not connected to the PEMs that are not included in the top layer of the second subset, and the PEMs in the top layer of the second subset are not connected to the select lines CS0T(0), CS0B(1), and CS1B(3). Thus, the PEMs in the top layer of the second subset can receive a signal from the select line CS1T(2) but cannot receive a signal from the select lines CS0T(0), CS0B(1), and CS1B(3).

Similarly, the select line CS1B(3) is connected to each of the PEMs in the second (e.g., bottom) layer of the second subset (in FIG. 2, the label C3 is used to identify the continuation of the select line CS1B(3) through the bottom layer of the second subset). The select line CS1B(3) is not connected to the PEMs that are not included in the bottom layer of the second subset, and the PEMS in the bottom layer of the second subset are not connected to the select lines CS0T(0), CS0B(1), and CS1T(2). Thus, the PEMs in the bottom layer of the second subset can receive a signal from the select line CS1B(3) but cannot receive a signal from the select lines CS0T(0), CS0B(1), and CS1T(2).

In one embodiment, a reset line RST is connected to each of the PEMs in the group of PEMs (in FIG. 2, the label R is used to indicate the continuation of the reset line to each of the PEMs 150).

Generally speaking, the interface 140 (FIG. 1) can program a PEM by concurrently activating one of the data lines, one of the clock lines, and one of the select lines. As just described, clock lines and select lines are shared across multiple data lines. One of ordinary skill in the art will recognize that, if the clock line for a device (e.g., a PEM) and the select line for that device are activated, then that device, unless it is prevented from doing so, will accept the data that is present on its data line, whether it is supposed to accept that data or not. In other words, when a particular combination of a clock line and a select line is activated, every device with that combination of clock and select lines will attempt to program in the data on their respective data lines, unless prevented from doing so. In embodiments according to the invention, functionality is included to allow a device to differentiate between data present on a data line that should be accepted versus data present on a data line that should be ignored or that can be accepted without affecting the existing programming of the device. In one embodiment, this is accomplished by disabling (or not setting) an enable bit that is embedded as part of the data stream on the data line. In one such embodiment, to disable the enable bit, all zeros are written to the data lines for deactivated devices (devices that are not to be programmed), thereby disabling the enable bit that is embedded in the data stream. Thus, a device that receives a data stream with the enable bit not set (e.g., with a "zero" at the position of the enable bit, such as a data stream that is all zeros) will ignore the data. Conversely, to activate the programming for a particular device, a "one" is put into the appropriate position in the data stream (at the position of the enable bit) and the device will accept the data. Other methods that can be used to cause a device to ignore or not be affected by a data stream include, but are not limited to: use of a benign address that, if programmed, does not result in programming the device because there are no functions tied to that address; and resending a data stream to the device that does not change the state of the device (that is, send the same data that was previously sent, thus reprogramming the device but keeping it in its existing state).

Thus, to program a particular PEM, the interface activates the particular clock line, the particular select line, and the particular data line that intersect or interconnect at that PEM, where that PEM is instructed to accept the data as just described. In other words, to program a particular PEM, the unique combination of data line, clock line, and select line that are all able to provide an input to that PEM is activated; other PEMs that share the same clock and select lines as the PEM to be programmed will not be programmed using one of the methods just described. PEMs that do not receive an active signal from either the clock line or the select line are not programmed (e.g., they are deactivated).

For ease of discussion, as used herein, an active or activated data line refers to a data line that is programmed with data and also includes information (e.g., an enable bit that is set) that effectively instructs a device to accept the data or that allows the device to accept the data but not be affected by it (e.g., a benign address or a duplicate of the previously written data).

For example, to program the PEM 044, the interface 140 activates the data line DIN0, the clock line SCLK0, and the select line CS0T(0). Note that, when the data line DIN0 is active, PEMs in addition to the PEM 044 will receive data (namely, the data intended for the PEM 044) over the data line DIN0; that is, PEMS 001, 002, 007, 008, 013, 014, 019, 020, 025, 026, 031, 032, 037, 038, 043, and 044 will all receive active data over the data line DIN0. Also, when the clock line SCLK0 is active, PEMs in addition to the PEM 044 will receive a clock signal (namely, the clock signal intended for the PEM 044); that is, the PEMs 019-024 and 043-048 will all receive a clock signal over the clock line SCLK0. Moreover, when the select line CS0T(0) is active, PEMs in addition to the PEM 044 will receive a select signal (namely, the signal intended for the PEM 044) over the select line CS0T(0); that is, the PEMs 026, 028, 030, 032, 034, 036, 038, 040, 042, 044, 046, and 048 will all receive a select signal. Thus, some of the PEMs do not receive any signals, some receive one signal, and some receive two signals; those devices are not programmed/activated. In this example, only one PEM (the PEM 044) receives all three (data, clock, and select) signals and is also instructed to accept the data (or is unaffected by the data); accordingly, that PEM is uniquely addressed and programmed by activating all control lines that connect with and are able to provide an input to that PEM.

Significantly, the group of PEMs 150 can be addressed and programmed using fewer control lines (serial buses) than conventionally required. In the example of FIG. 2, a group of 48 PEMs can be addressed/programmed using only 11 control lines: three data lines, four clock lines, and four select lines. In general, a three-dimensional arrangement of PEMs having K rows, 2×M columns, and N/2 layers (where K and M are integers greater than one and N is an even integer greater than two) can be addressed and programmed using only K data lines, M clock lines, and N select lines.

Consequently, routing of the control lines is simplified. Furthermore, costs are reduced, and the serial lines consume fewer resources (e.g., physical area and pins). Also, embodiments according to the present invention are readily scalable to larger number of PEMs. For instance, in the example of FIG. 2, 16 additional PEMs can be accommodated by adding one more row per layer and one more data line, 12 additional PEMs can be accommodated by adding one more column per subset and layer and one more clock line, and 24 additional PEMs can be accommodated by adding another layer per subset and two more select lines. Accordingly, embodiments according to the present invention are adaptable to different numbers of PEMs and to different testing requirements.

In the example presented above, a single PEM is addressed and programmed by activating the combination of data line, clock line, and select line that uniquely corresponds to that PEM. Multiple PEMs can also be concurrently programmed by concurrently activating more than one of the data lines, clock lines, and/or select lines. For example, all of the PEMs in R1 top layer (PEMs 002, 008, 014, 020, 026, 032, 038, and 044) can be concurrently programmed with the same data by concurrently activating the data line DIN0, the clock lines SCLK0-3, and the select lines CS0T(0) and CS1T(2). Similarly, all of the PEMs in C1 top layer (PEMs 044, 046, and 048) can be concurrently programmed with the same or different data by concurrently activating the data lines DIN0-2, the clock line SCLK0, and the select line CS0T(0). In general, multiple PEMs can be concurrently programmed by concurrently activating more than one of the data lines in combination with at least one of the clock lines and at least one of the select lines, by concurrently activating more than one of the clock lines in combination with at least one of the data lines and at least one of the select lines, or by concurrently activating more than one of the select lines in combination with at least one of the data lines and at least one of the clock lines.

Figure 3:
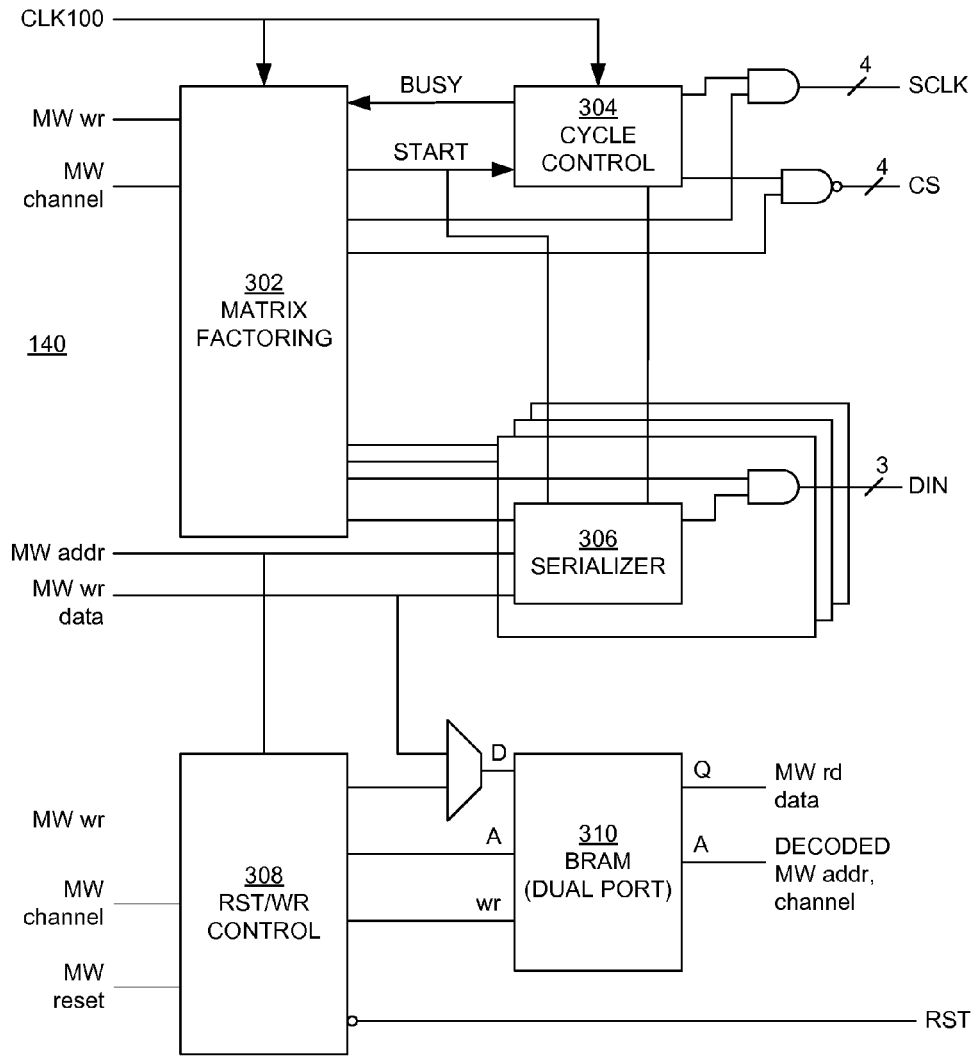
FIG. 3 is a block diagram illustrating an interface in an embodiment according to the present invention.

FIG. 3 is a block diagram illustrating the interface 140 in an embodiment according to the present invention. In the example of FIG. 3, the interface 140 includes a matrix factoring block 302, a cycle control block 304, a serializer 306, a RST/WR control block 308, and a block random access memory (BRAM) 310. In the FIG. 3 embodiment, the interface 140 runs from a 100 MHz global clock (CLK100), corresponding to a data rate of 25 MHz. Thus, the serializer 306 shifts every four periods of the global clock.

In general, the interface 140 receives parallel inputs: e.g., MW (machine word) writes (wr), MW channel, MW address (addr), MW wr data, and MW reset (rst). Generally speaking, these inputs constitute an instruction that identifies a PEM or PEMs to be programmed and the data to be written to the PEM(s). The interface 140 translates the parallel inputs into serial outputs, which are the serial inputs (SCLK, CS, and DIN) for the identified PEM(s). In the FIG. 4 embodiment, there are four SCLK lines, four CS lines, and three DIN lines. In essence, the interface 140 translates the parallel inputs it receives into the particular combination of SCLK, CS, and DIN lines that addresses a PEM or PEMs to be programmed, and activates that combination of lines to write the data to the PEM(s).

In one embodiment, written values are mirrored in the BRAM 310 so that the value most recently written can be read by software. Because the channels may be in scrambled (non-sequential) order, the numbering of the PEMs may not be in the same order as the channel numbers; hence, appropriate mapping of channel to PEM is performed.

Not all elements are shown in FIG. 3. For example, the SCLK, CS, and DIN outputs can be registered to improve timing. Also, MW inputs can be latched to program the PEMs in parallel with other MW inputs. Buffers and termination elements that protect signal integrity are also not shown.

Figure 4:
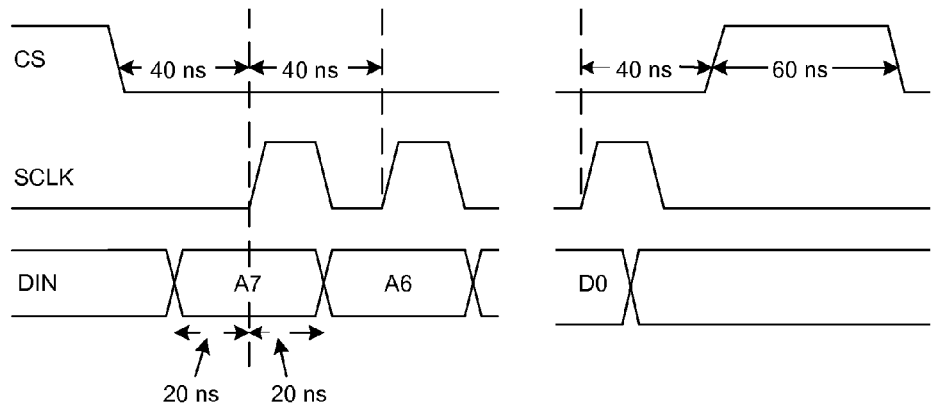
FIG. 4 is an example of a timing diagram for control signals in an embodiment according to the present invention.

FIG. 4 is an example of a timing diagram for control signals in an embodiment according to the present invention. Certain time periods (e.g., 20, 40, and 60 nano-seconds) are presented; however, such values are examples and embodiments according to the present invention are not so limited.

In the example of FIG. 4, data is made available on the falling edge of a clock. Depending on which channels are being written, one or more data lines (DIN) can have active data. A data stream containing inactive data may be all-zeros (thus disabling an enable bit in the data stream, as described previously herein), and will not be decoded by the PEMs 150 (FIGS. 1 and 2). Alternatively, as described previously herein, inactive data may be derived from the last-written value stored in the BRAM 310 (FIG. 3) if the PEM is unaffected by the previously written value being written again, or it may be associated with a benign address.

Depending on which channels are being written, one or more clock lines (SCLK) can be active. An SCLK clock is generated for necessary lines during a write cycle; otherwise, clock lines are idle (e.g., low). In an embodiment utilizing a 100 MHz global clock, an SCLK clock is generated every 25 MHz (100 MHz/4).

Depending on which channels are being written, one or more select lines (CS) will be active during the write; otherwise, they will be inactive (e.g., high). To give sufficient timing margin on this signal, the CS-high hold time from the final SCLK rising edge is one full period. The CS-low setup time prior to the initial SCLK falling edge is one full period. The CS is high for six periods of the global clock to ensure ample timing margins.

Reset (RST) is common to all of the PEMs and is asserted while the BRAM 310 (FIG. 3) is written with default values.

Figure 5:
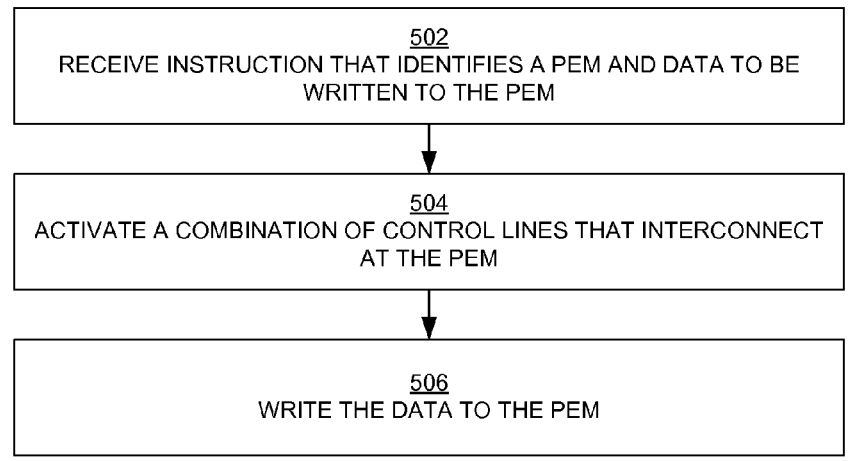
FIG. 5 is a flowchart of a method for programming PEMs in an embodiment according to the present invention.

FIG. 5 is a flowchart 500 of an example of a method of programming PEMs in an embodiment according to the present invention. Although specific steps are disclosed in the flowchart 500, such steps are exemplary. That is, embodiments according to the present invention are well suited to performing various other steps or variations of the steps recited in the flowchart 500. The flowchart 500 can be implemented using the interface 140 of FIGS. 1 and 3, for example.

In block 502 of FIG. 5, an instruction is received (e.g., at the interface 140). The instruction includes information identifying a PEM and data to be written to the PEM.

In block 504, a combination of a data line, a clock line, and a select line corresponding to (e.g., interconnecting or intersecting at) the PEM is activated.

In block 506, the data is written to the PEM.

While the operations in FIG. 5 are described for an example using a singular PEM, those operations can be readily extended to program multiple PEMs as previously described herein.

In summary, embodiments according to the present invention reduce the number of control lines (serial buses) and the number of I/O pins needed to program PEMs used by ATE. Consequently, costs are reduced and resources are saved, and routing of the lines is simplified. Furthermore, embodiments according to the invention are readily scalable to larger number of PEMs and thus can accommodate different or changing test requirements.

Embodiments according to the present invention are useful for devices that do not have a serial-out pin or cannot be daisy-chained for some reason. Furthermore, embodiments according to the present invention can perform writes faster than daisy-chained devices.

In the foregoing specification, embodiments of the invention have been described with reference to numerous specific details that may vary from implementation to implementation. Thus, the sole and exclusive indicator of what is, and is intended by the applicant to be, the invention is the set of claims that issues from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A system comprising:
a controller; and
a plurality of serial input devices coupled to the controller via control lines, the plurality of serial input devices comprising a first subset of the serial input devices arrayed in columns and rows and a second subset of the serial input devices arrayed in columns and rows, the control lines comprising: a first plurality of first control lines, each of the first control lines coupled to a single respective row in the first subset and a single respective row in the second subset; a second plurality of second control lines, each of the second control lines coupled to a single respective column in the first subset and a single respective column in the second subset; and a third plurality of third control lines comprising a control line coupled to each serial input device in the first subset and a control line coupled to each serial input device in the second subset;
wherein a serial input device in the plurality of serial input devices is programmed by concurrently activating one of the first control lines, one of the second control lines, and one of the third control lines.

2. The system of claim 1, further comprising an interface coupled to the controller and the serial input devices, wherein the interface is configured to convert parallel inputs into serial inputs for the serial input devices.

3. The system of claim 2, wherein the interface receives information that identifies the serial input device, wherein further the interface is configured to use the information to activate the one of the first control lines, the one of the second control lines, and the one of the third control lines that are operable for providing an input to program the serial input device, wherein further any of the serial input devices that does not have an activated first control line, an activated second control line, and an activated third control line is not programmed.

4. The system of claim 1, wherein the first control lines comprise data lines, the second control lines comprise clock lines, and the third control lines comprise select lines.

5. The system of claim 2, wherein the interface is further operable for programming multiple serial input devices in the plurality of serial input devices by performing an operation selected from the group consisting of: concurrently activating more than one of the first control lines in combination with at least one of the second control lines and at least one of the third control lines; concurrently activating more than one of the second control lines in combination with at least one of the first control lines and at least one of the third control lines; and concurrently activating more than one of the third control lines in combination with at least one of the first control lines and at least one of the second control lines.

6. The system of claim 1, wherein the control lines further comprise a reset line coupled to each serial input device in the plurality of serial input devices.

7. The system of claim 2, further comprising a programmable logic device comprising the interface.

8. The system of claim 1, wherein the serial input devices comprise pin electronics modules.

9. The system of claim 1, wherein the plurality of serial input devices are arranged in multiple layers.

10. A system comprising:
an interface coupled to a controller;
a three-dimensional arrangement of pin electronics modules (PEMs), the arrangement comprising K rows, 2×M columns, and N/2 layers, where K and M are integers greater than one and N is an even integer greater than two; and
a plurality of serial control lines coupled between the interface and the PEMs, the control lines comprising K data lines, M clock lines, and N select lines, wherein the interface is operable for programming a PEM in the arrangement of PEMs by concurrently activating one of the data lines, one of the clock lines, and one of the select lines.

11. The system of claim 10, wherein the interface is configured to convert parallel inputs into serial inputs for the PEMs.

12. The system of claim 10, wherein the interface receives information that identifies the PEM, wherein further the interface is configured to use the information to activate the one of the data lines, the one of the clock lines, and the one of the select lines that are operable for providing inputs to the PEM, wherein further any of the PEMs that does not have an activated first data line, an activated clock line, and an activated select line is not programmed.

13. The system of claim 10, wherein the interface is further operable for programming multiple PEMs in the plurality of PEMs by performing an operation selected from the group consisting of: concurrently activating more than one of the data lines in combination with at least one of the clock lines and at least one of the select lines; concurrently activating more than one of the clock lines in combination with at least one of the data lines and at least one of the select lines; and concurrently activating more than one of the select lines in combination with at least one of the data lines and at least one of the clock lines.

14. The system of claim 10, wherein the control lines further comprise a reset line coupled to each PEM in the plurality of PEMs.

15. The system of claim 10, further comprising a programmable logic device comprising the interface.

16. A method comprising:
receiving an instruction comprising information identifying a pin electronics module (PEM) in a plurality of PEMs and further comprising data to be written to the PEM, wherein the PEMs are coupled to control lines and wherein the PEMs comprise a first subset of the PEMs arrayed in columns and rows and a second subset of the PEMs arrayed in columns and rows, the control lines comprising: a first plurality of first control lines, each of the first control lines coupled to a single respective row in the first subset and a single respective row in the second subset; a second plurality of second control lines, each of the second control lines coupled to a single respective column in the first subset and a single respective column in the second subset; and a third plurality of third control lines comprising a control line coupled to each PEM in the first subset and a control line coupled to each PEM in the second subset;
activating a combination of one of the first control lines, one of the second control lines, and one of the third control lines, the combination interconnecting at the PEM; and
writing the data to the PEM.

17. The method of claim 16, further comprising converting parallel inputs into serial inputs for the PEMs.

18. The method of claim 16, further comprising:
receiving an instruction that identifies the PEM; and
activating the one of the first control lines, the one of the second control lines, and the one of the third control lines that interconnect at the PEM indentified in the instruction, wherein any of the PEMs that does not have an activated first control line, an activated second control line, and an activated third control line is not programmed.

19. The method of claim 16, wherein the first control lines comprise data lines, the second control lines comprise clock lines, and the third control lines comprise select lines.

20. The method of claim 19, further comprising writing data to multiple PEMs in the plurality of PEMs by performing an operation selected from the group consisting of: concurrently activating more than one of the data lines in combination with at least one of the clock lines and at least one of the select lines; concurrently activating more than one of the clock lines in combination with at least one of the data lines and at least one of the select lines; and concurrently activating more than one of the select lines in combination with at least one of the data lines and at least one of the clock lines.

21. The method of claim 16, wherein the control lines further comprise a reset line coupled to each PEM in the plurality of PEMs and wherein the plurality of PEMs are arranged in multiple layers.

* * * * *